(12) United States Patent
Sato et al.

(10) Patent No.: US 10,177,328 B2
(45) Date of Patent: Jan. 8, 2019

(54) ELECTRONIC DEVICE AND METHOD OF MANUFACTURING THE SAME

(71) Applicant: FUJITSU LIMITED, Kawasaki-shi, Kanagawa (JP)

(72) Inventors: Shintaro Sato, Atsugi (JP); Ayaka Yamada, Ebina (JP); Katsunori Yagi, Machida (JP); Makoto Takahashi, Ichihara (JP)

(73) Assignee: FUJITSU LIMITED, Kawasaki (JP)

( * ) Notice: Subject to any disclaimer, the term of this patent is extended or adjusted under 35 U.S.C. 154(b) by 95 days.

(21) Appl. No.: 14/971,400

(22) Filed: Dec. 16, 2015

(65) Prior Publication Data

US 2016/0104852 A1  Apr. 14, 2016

Related U.S. Application Data

(63) Continuation of application No. PCT/JP2014/051843, filed on Jan. 28, 2014.

(30) Foreign Application Priority Data

Jun. 21, 2013 (JP) .................................. 2013-130816

(51) Int. Cl.
*H01L 51/05* (2006.01)
*H01L 29/423* (2006.01)
(Continued)

(52) U.S. Cl.
CPC ...... *H01L 51/0562* (2013.01); *H01L 29/1606* (2013.01); *H01L 29/42312* (2013.01); (Continued)

(58) Field of Classification Search
CPC ............. H01L 51/0562; H01L 51/0094; H01L 51/0002; H01L 51/0032; H01L 51/004; (Continued)

(56) References Cited

U.S. PATENT DOCUMENTS

2012/0037907 A1  2/2012  Whiting
2013/0313522 A1  11/2013  Nourbakhsh

FOREIGN PATENT DOCUMENTS

JP  2008-130761 A1  6/2008
JP  2009-065057 A  * 3/2009
(Continued)

OTHER PUBLICATIONS

Single-Gate Bandgap Opening of Bilayer Graphene by Dual Molecular Doping, Jaesung Park et al., Advanced Materials, 2012, 24, p. 407-411.*

(Continued)

*Primary Examiner* — Mohammed R Alam
(74) *Attorney, Agent, or Firm* — Kratz, Quintos & Hanson, LLP

(57) ABSTRACT

An electronic device includes: a nanocarbon material; a pair of electrodes that is electrically connected to the nanocarbon material; a lower layer that is formed under the nanocarbon material and is made of at least one kind of a molecular material having a doping function; and an upper layer that is formed on the nanocarbon material and is made of at least two kinds of molecular materials having doping functions whose polarities are reverse to each other, in which the nanocarbon material constitutes one type selected from among an NPN structure, a PNP structure, an $N^+P^-P^+$ structure, and a $P^+N^-N^+$ structure in a region between the pair of electrodes by the lower layer and the upper layer. By this constitution, a highly reliable electronic device including a band gap formed by the molecular materials and using the nanocarbon material as a channel with a relatively simple structure is fabricated.

11 Claims, 8 Drawing Sheets

(51) Int. Cl.
    *H01L 29/66*     (2006.01)
    *H01L 29/778*     (2006.01)
    *H01L 29/808*     (2006.01)
    *H01L 29/16*     (2006.01)
    *H01L 29/786*     (2006.01)
    *H01L 51/00*     (2006.01)

(52) U.S. Cl.
    CPC .. *H01L 29/42364* (2013.01); *H01L 29/66045* (2013.01); *H01L 29/778* (2013.01); *H01L 29/78603* (2013.01); *H01L 29/78684* (2013.01); *H01L 29/78696* (2013.01); *H01L 29/808* (2013.01); *H01L 29/8086* (2013.01); *H01L 51/0002* (2013.01); *H01L 51/004* (2013.01); *H01L 51/0032* (2013.01); *H01L 51/0045* (2013.01); *H01L 51/0094* (2013.01); *H01L 2251/10* (2013.01)

(58) Field of Classification Search
    CPC ........... H01L 51/0045; H01L 29/78684; H01L 29/78603; H01L 29/78696; H01L 29/778; H01L 29/808; H01L 29/8086; H01L 29/1606

See application file for complete search history.

(56) References Cited

FOREIGN PATENT DOCUMENTS

| | | |
|---|---|---|
| JP | 2009-065057 A | 3/2009 |
| JP | 2009-65057 A1 | 3/2009 |
| JP | 2009-277803 A1 | 11/2009 |
| JP | 2012-516560 A1 | 7/2012 |
| JP | 2013-110246 A1 | 6/2013 |

OTHER PUBLICATIONS

H. Sugimura, et al.; "Organosilane self-assembled monolayers formed at the vapour/solid interface;" Surface and Interface Analysis; vol. 34; 2002; pp. 550-554 (5 Sheets)/p. 2 of specification.

K.S. Novoselov, et al.; "Electric Field Effect in Atomically Thin Carbon Films;" Science; vol. 306; Oct. 22, 2004; pp. 666-669 and cover sheet (5 Sheets)/p. 2 of specification.

S. Lee, et al.; "Wafer Scale Homogeneous Bilayer Graphene Films by Chemical Vapor Deposition;" Nano Letters; vol. 10; 2010; pp. 4702-4707 (6 Sheets)/p. 3 of specification.

Office Action of Taiwanese Patent Application No. 103103500 dated May 29, 2015 (3 Sheets, 3 Sheets translation, 6 Sheets total).

Written Opinion of the International Searching Authority for International Application No. PCT/JP2014/051843 dated Apr. 1, 2014 (6 Sheets total).

International Search Report for International Application No. PCT/JP2014/051843 dated Apr. 1, 2014.

Office Action for counterpart Taiwanese Patent Application No. 103103500 dated Oct. 19, 2017 (7 Sheets, 6 Sheets translation, 13 Sheets total).

* cited by examiner

ELECTRONIC DEVICE AND METHOD OF MANUFACTURING THE SAME

CROSS-REFERENCE TO RELATED APPLICATIONS

This application is a continuation application of International Application PCT/JP2014/051843 filed on Jan. 28, 2014, and designated the U.S., which claims the benefit of priority of the prior Japanese Patent Application No. 2013-130816, filed on Jun. 21, 2013, the entire contents of which are incorporated herein by reference.

FIELD

The embodiments discussed herein are directed to an electronic device and a method of manufacturing the same.

BACKGROUND

Current LSIs have been improved in characteristics by miniaturization. However, in accordance with the progress of the miniaturization, a gate length of transistors has become below 30 nm, which is giving rise to adverse effects of the miniaturization. Therefore, an attempt is being made to achieve the characteristic improvement by using channel materials having a higher mobility instead of conventionally used silicon. As candidates for these materials, compound semiconductors such as germanium and InGaAs are named, but graphene that is a two-dimensional material and has a very high mobility is also drawing attention.

Having a high mobility of 100,000 $cm^2/Vs$ or so even at room temperature and being free from difference in mobility between electrons and holes, graphene is expected as a future channel material. However, not having a band gap, the graphene has a small on-off ratio as it is and its use as a switching element is difficult. Therefore, in order to form a band gap, various methods such that graphene is processed into a ribbon shape have been proposed. As one of such methods, a method of vertically applying an electric field to two-layer graphene has been proposed. In this case, a device structure becomes slightly complicated because an electrode is provided on an upper surface and a lower surface of the two-layer graphene. There is also performed an attempt to deposit a molecular material that performs doping of holes and electrons on an upper layer and a lower layer of the two-layer graphene each instead of providing the electrodes, to form a band gap.

Non-Patent Document 1: H. Sugimura et al., Surf. Interf. Anal. 34 (2002) 550.
Non-Patent Document 2: K. S. Novoselov et al., Science 306 (2004) 666.
Non-Patent Document 3: S. Lee et al., Nano Lett. 10 (2010) 4702.

The attempt to deposit a molecular material on and under the two-layer graphene, to form a band gap is advantageous to the device manufacture because of the fact that there is no need to provide electrodes for electric field application in a device structure. However, the present situation is that only the principle verification of band gap formation has been performed so far, and how the transistor structure is made in practice has not been settled yet.

SUMMARY

An electronic device according to the embodiment includes: a nanocarbon material; a pair of electrodes that is electrically connected to the nanocarbon material; a lower layer that is formed under the nanocarbon material and is made of at least one kind of a molecular material having a doping function; and an upper layer that is formed on the nanocarbon material and is made of at least two kinds of molecular materials having doping functions whose polarities are reverse to each other, in which the nanocarbon material constitutes one type selected from among an NPN structure, a PNP structure, an $N^+P^-P^+$ structure, and a $P^+N^-N^+$ structure in a region between the pair of electrodes by the lower layer and the upper layer.

A method of manufacturing an electronic device according to the embodiment includes: forming a lower layer that is made of at least one kind of a molecular material having a doping function; forming a nanocarbon material on the lower layer; forming a pair of electrodes that is electrically connected to the nanocarbon material; and forming an upper layer that is formed on the nanocarbon material and is made of at least two kinds of molecular materials having doping functions whose polarities are reverse to each other, in which the nanocarbon material constitutes one type selected from among an NPN structure, a PNP structure, an $N^+P^-P^+$ structure, and a $P^+N^-N^+$ structure in a region between the pair of electrodes by the lower layer and the upper layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, a transistor using graphene for a channel material (graphene transistor) is disclosed. In this embodiment, a constitution of the graphene transistor is explained together with its manufacturing method.

FIG. 1A to FIG. 2C are schematic cross-sectional views illustrating the method of manufacturing the graphene transistor according to a first embodiment in order of processes.

Figure 1A:
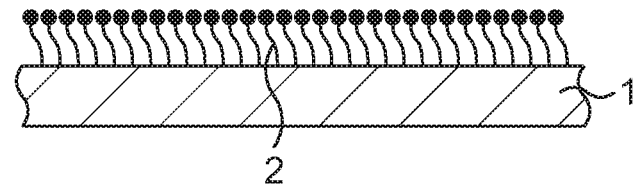
FIG. 1A is schematic cross-sectional view illustrating a method of manufacturing a graphene transistor according to a first embodiment in order of processes.

First, as illustrated in FIG. 1A, a lower layer 2 is formed on a substrate 1.

In more detail, first, the substrate 1, which is a Si substrate here, is prepared, and on the Si substrate, a silicon oxide film is formed by thermal oxidation or the like.

Next, on the silicon oxide film, the lower layer 2 is formed as what is called a SAM film being a monomolecular layer by a gas phase method (see Non-Patent Document 1).

In more detail, the substrate 1 obtained by the silicon oxide film being formed on Si and as a molecular material, electron-donating N-type dopant molecules put in an open container, which are N-dimethyl-3-aminopropylmethoxysilane here, are sealed in an airtight container made of Teflon (registered trademark) in a glove box under an atmospheric pressure. Thereafter, the airtight container is placed in an electric furnace and subjected to heat treatment for several hours or so. The heating temperature is set to, for example, 100° C. By the heat treatment, a SAM film of N-dimethyl-3-aminopropylmethoxysilane, (which will be described as $N(CH_3)_2$-SAM, hereinafter), is formed on the silicon oxide film.

Next, the formed SAM film is subjected to various treatments. Specifically, a toluene treatment and an ethanol treatment are performed for 10 minutes or so each in sequence. Thereafter, a blow treatment is performed with $N_2$.

Thus, the lower layer 2 being the SAM film is formed.

Figure 1B:
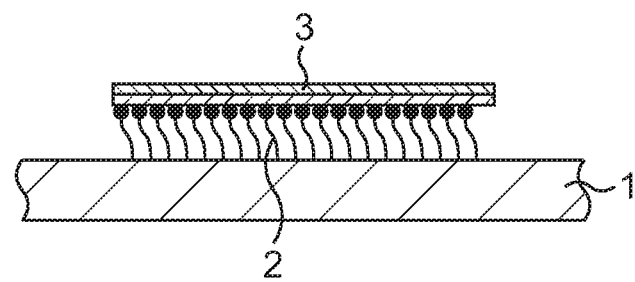
FIG. 1B is a schematic cross-sectional view illustrating, subsequent to FIG. 1A, the method of manufacturing the graphene transistor according to the first embodiment in order of processes.

Subsequently, as illustrated in FIG. 1B, two-layer graphene 3 is formed by transfer on the lower layer 2, and the lower layer 2 and the two-layer graphene 3 are processed.

The two-layer graphene may be transferred from graphite crystals using a peeling method with an adhesive tape (see Non-Patent Document 2), or one obtained by a CVD method may also be transferred (see Non-Patent Document 3).

Next, the transferred graphene and the lower layer 2 are appropriately processed by lithography and etching. Dry etching using oxygen plasma and/or the like, for example, is used for the etching of the graphene. Dry etching using oxygen plasma or UV ozone, for example, is used for the etching of the lower layer 2. Thus, the two-layer graphene 3 constituting a channel region is formed on the lower layer 2.

Figure 1C:
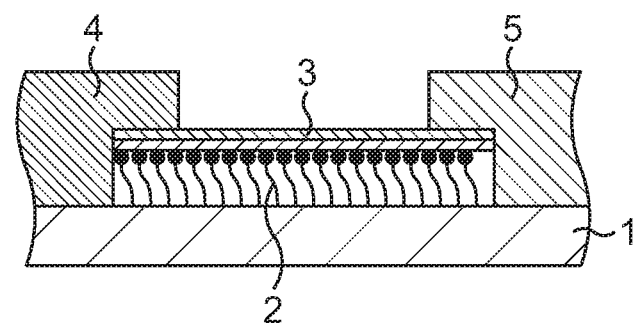
FIG. 1C is a schematic cross-sectional view illustrating, subsequent to FIG. 1B, the method of manufacturing the graphene transistor according to the first embodiment in order of processes.

Subsequently, as illustrated in FIG. 1C, a source electrode 4 and a drain electrode 5 are formed so as to come into contact with both end portions of the two-layer graphene 3.

In more detail, a resist is applied to the entire surface so as to cover the lower layer 2 and the two-layer graphene 3 and the resist is processed by photolithography to form an opening in forming regions of the source electrode and the drain electrode each. An electrode material is continuously deposited on the entire surface including the inside of the openings. As the electrode material, for example, Ti/Au (Ti for the lower layer) are used, and Ti is deposited into a thickness of 20 nm or so and Au is deposited into a thickness of 500 nm or so in sequence. Ti is formed relatively thickly, to thereby function as a conductive material that hardly modulates an electronic state of the N-type portion of the two-layer graphene 3. By a lift-off method, the resist and Ti and Au thereon are removed. Thus, the source electrode 4 and the drain electrode 5 being a pair of electrodes are formed so as to come into contact with the both end portions of the two-layer graphene 3.

Incidentally, in consideration of viewability of the drawing, illustration of the two-layer structure (Ti/Au) of the source electrode 4 and the drain electrode 5 is omitted.

Figure 2A:
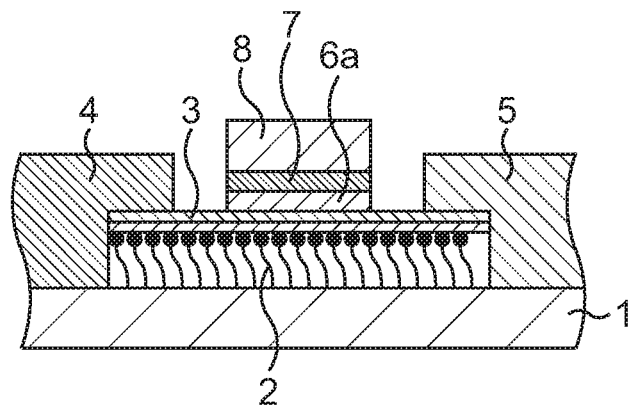
FIG. 2A is a schematic cross-sectional view illustrating, subsequent to FIG. 1C, the method of manufacturing the graphene transistor according to the first embodiment in order of processes.

Subsequently, as illustrated in FIG. 2A, a gate electrode 8 is formed on the two-layer graphene 3 via a first upper layer 6a and a gate insulating film 7.

In more detail, first, a resist is applied to the entire surface so as to cover the two-layer graphene 3 and the resist is processed by photolithography to form an opening in a forming region of the gate electrode.

Next, on the entire surface including the inside of the opening of the resist, as a molecular material, electron-withdrawing (hole-donating) P-type dopant molecules, which are $F_4$-TCNQ (2,3,5,6-tetrafluoro-7,7,8,8-tetracyano-quinodimethane) here, are deposited. $F_4$-TCNQ is deposited into a thickness of 2 nm or so, for example, by a vacuum deposition method, for example.

Next, polyvinyl alcohol (PVA) is deposited into a thickness of several nanometers or so by a spin coat method or a dip method. Using PVA as a seed layer, an insulating material, for example, $HfO_2$ is deposited on the entire surface including the inside of the opening of the resist. $HfO_2$ is deposited into a thickness of 10 nm or so, for example, by an atomic layer deposition (Atomic Layer Deposition: ALD method), for example.

Incidentally, the deposition of $HfO_2$ may also be performed by a plasma CVD method, a sputtering method, or the like, for example, in place of the ALD method. Further, instead of depositing $HfO_2$, a nitride or an oxynitride of Hf may also be used. Besides, an oxide, a nitride, or an oxynitride of Si, Al, Zr, Ti, Ta, W may be used or they may also be appropriately selected and deposited into multiple layers.

Next, an electrode material, which is Ti/Au, for example, is deposited on the entire surface including the inside of the opening of the resist by a vacuum deposition method or the like.

Then, by a lift-off method, the resist and $F_4$-TCNQ, PVA, $HfO_2$, and Ti/Au thereon are removed. Thus, there is formed a structure made by the first upper layer 6a made of $F_4$-TCNQ, the gate insulating film 7 made of $HfO_2$, and the gate electrode 8 made of Ti/Au being stacked in sequence on the two-layer graphene 3. Incidentally, in consideration of viewability of the drawing, illustration of the two-layer structure (Ti/Au) of the gate electrode 8 is omitted.

Figure 2B:
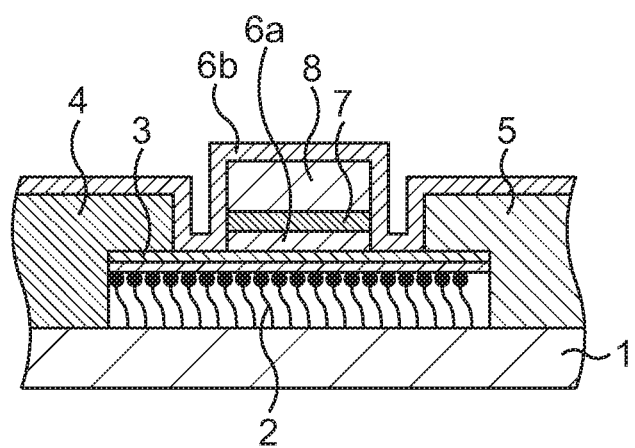
FIG. 2B is a schematic cross-sectional view illustrating, subsequent to FIG. 2A, the method of manufacturing the graphene transistor according to the first embodiment in order of processes.

Subsequently, as illustrated in FIG. 2B, a second upper layer 6b is formed at both sides of the first upper layer 6a.

In more detail, on the entire surface including the surface of the two-layer graphene 3 exposed between the gate electrode 8 and the source electrode 4 and the surface of the two-layer graphene 3 exposed between the gate electrode 8 and the drain electrode 5, as a molecular material, electron-donating N-type dopant molecules, which are PEI (Polyethylenimine) here, are deposited. PEI is deposited by a vacuum deposition method, for example. Thereby, the second upper layer 6b made of PEI is formed in a self-aligned manner at the both sides of the first upper layer 6a on the two-layer graphene 3.

Figure 2C:
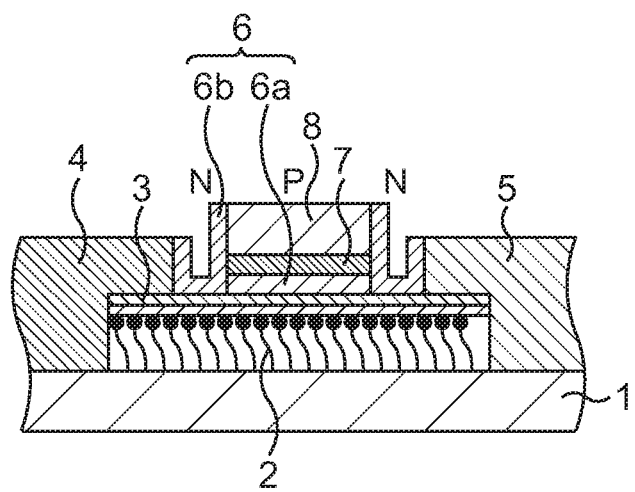
FIG. 2C is a schematic cross-sectional view illustrating, subsequent to FIG. 2B, the method of manufacturing the graphene transistor according to the first embodiment in order of processes.

Subsequently, as illustrated in FIG. 2C, only the upper layer 6b between the gate electrode 8 and the source electrode 4 and the upper layer 6b between the gate electrode 8 and the drain electrode 5 are left.

In more detail, the entire surface of the upper layer 6b is anisotropically dry-etched (etched back). Thereby, the upper layer 6b on the source electrode 4, the upper layer 6b on the drain electrode 5, and the upper layer 6b on the gate electrode 8 are removed, and the second upper layer 6b is left only between the gate electrode 8 and the source electrode 4 and between the gate electrode 8 and the drain electrode 5. Thus, an upper layer 6 constituted of the first upper layer 6a and the second upper layer 6b covering the region between the source electrode 4 and the drain electrode 5 on the two-layer graphene 3 is constituted.

Thereafter, by going through various processes of formation of wiring connected to the source electrode 4, the drain electrode 5, and the gate electrode 8, formation of a protective film, and the like, the graphene transistor is formed.

In the graphene transistor according to this embodiment, the lower layer 2 is formed under the two-layer graphene 3 and the upper layer 6 is formed on the two-layer graphene 3 so as to sandwich the two-layer graphene 3. The lower layer 2 is formed of $N(CH_3)_2$-SAM being the electron-donating N-type dopant molecule. The upper layer 6 is constituted by the first upper layer 6a made of $F_4$-TCNQ being the electron-withdrawing (hole-donating) P-type dopant molecule and formed in a portion below the gate electrode 8 and the second upper layer 6b made of PEI being the electron-donating N-type dopant molecule and formed at the both side portions of the gate electrode 8.

The two-layer graphene 3 is sandwiched between the lower layer 2 being the N-type dopants for the two-layer graphene 3 and the first upper layer 6a being the P-type dopants for the two-layer graphene 3 in the aligned region below the gate electrode 8. In this case, the property as the P-type dopant of the first upper layer 6a is stronger than that as the N-type dopant of the lower layer 2. Therefore, the two-layer graphene 3 becomes a P type as a whole in the region while forming a band gap.

In the meantime, of the two-layer graphene 3, the regions aligned with the both sides of the gate electrode 8 are each sandwiched between the lower layer 2 being the N-type dopants for the two-layer graphene 3 and the second upper layer 6b being the N-type dopants for the two-layer graphene 3 similarly. In this case, although the two-layer graphene 3 becomes an N type in the regions, a band gap is formed due to the difference in electron donating property between the upper and lower molecular materials.

Further, at this time, even when the upper layer 6b is a weak P-type dopant or other than the dopant, the two-layer graphene 3 becomes an N type and further a band gap is also formed.

Incidentally, in this embodiment, on the graphene on the N dopant SAM film, the molecular materials to be the P dopant and the N dopant are deposited to form an NPN structure, but even on a silicon oxide film, boron nitride, or the like without the SAM film, for example, the NPN structure is fabricated even though the gap is decreased. Further, the same thing is feasible even by changing only the doping polarity of the SAM film and depositing a film having no doping ability on the upper layer.

As above, in the graphene transistor in this embodiment, the two-layer graphene 3 substantially becomes an NPN structure in the channel region between the source electrode 4 and the drain electrode 5, and a sufficient band gap is formed.

In this embodiment, when forming the first upper layer 6a and the second upper layer 6b constituting the upper layer 6, the rate of these to cover the two-layer graphene 3 is adjusted, thereby making it possible to control individual conductivity-type doping states (concentrations) of N, P, and N in the NPN structure. For example, it is also possible that the covering rate of the first upper layer 6a is adjusted and the property as the P-type dopant (the concentration of the P-type dopant for the two-layer graphene 3 from the first upper layer 6a) is made equivalent to the property as the N-type dopant of the lower layer 2 (the concentration of electrons supplied into the two-layer graphene 3 from the lower layer 2), to thereby bring P of NPN into substantially an I (intrinsic) state.

In this embodiment, as the N-type dopant molecule, $N(CH_3)_2$-SAM and PEI are cited, and as the P-type dopant molecule, $F_4$-TCNQ is cited, but these are one example, and the following molecular materials can be used.

TABLE 1

| p | n |
|---|---|
| $F_4$—TCNQ, $F_2$—HCNQ, TCNQ, $F_2$—TCNQ, $NO_2$, PENTACENE FLUORIDE, DIAZONIUM SALT, BENZYLVIOLOGEN, ALKYLSILANE FLUORIDE, N-PHENYL-3-AMINOTRIMETHOXYSILANE, 3-MERCAPTOTRIMETHOXYSILANE | PEI, FERROCENE, COBALTOCENE, TETRATHIAFULVALENE (TTF), $NH_2$—SAM, $NH(CH_3)$—SAM, $N(CH_3)_2$—SAM |

As the N-type dopant molecule, in addition to the ones described above, it is possible to use at least one kind of molecule selected from among PEI, ferrocene, cobaltocene, tetrathiafulvalene (TTF), 3-aminopropyltrimethoxy(ethoxy) silane (to be described as $NH_2$-SAM when it is used as the SAM film), N-methyl-3-aminopropylmethoxysilane (to be described as $NH(CH_3)$-SAM when it is used as the SAM film), and N-dimethyl-3-aminopropylmethoxysilane.

As the P-type dopant molecule, in addition to the one described above, it is possible to use at least one kind of molecule selected from among $F_4$-TCNQ, $F_2$-HCNQ, TCNQ, $F_2$-TCNQ, $NO_2$, pentacene fluoride, diazonium salts (4-(N,N-Dimethylamino)benzenediazonium Tetrafluoroborate, 4-Bromobenzenediazonium Tetrafluoroborate, and so on), benzylviologen, alkylsilane fluoride (heptadecafluoro-1,1,2,2-tetrahydro-decyl-1-trimethoxysilane or the like), N-phenyl-3-aminotrimethoxysilane, and 3-mercaptotrimethoxysilane.

In the graphene transistor having an NPN structure according to this embodiment, the molecular material of the lower layer 2, the molecular materials of the first upper layer 6a and the second upper layer 6b constituting the upper layer 6, and the electrode material of the source electrode 4 and the drain electrode 5 can be selected as follows.

TABLE 2

| NPN STRUCTURE CASE | | | |
|---|---|---|---|
| | N | P | N |
| UPPER-SIDE MATERIAL | PEI/TCNQ/ FERROCENE/ COBALTOCENE/ TTF | $F_4$—TCNQ/ $F_2$—HCNQ | PEI/TCNQ/ FERROCENE/ COBALTOCENE/ TTF |
| LOWER-SIDE MATERIAL | $NH_2$—SAM/ $NH(CH_3)$—SAM/ $N(CH_3)_2$—SAM | $NH_2$—SAM/ $NH(CH_3)$—SAM/ $N(CH_3)_2$—SAM/ ALKYLSILANE FLUORIDE | $NH_2$—SAM/ $NH(CH_3)$—SAM/ $N(CH_3)_2$—SAM |

ELECTRODE MATERIAL: Ti, Zr, Hf, V, Ta, Sc, Y, La

For the material of the N-type dopant molecule of the lower layer 2 (lower-side material), one kind selected from among $NH_2$-SAM, $NH(CH_3)$-SAM, and $N(CH_3)_2$-SAM is used.

Incidentally, it is also possible that the P-type dopant molecule, for example, alkylsilane fluoride is formed in a portion positioned lower in the first upper layer 6a and the above-described selected one kind is formed in portions positioned lower in the second upper layer 6b. This makes it possible to securely adjust the P-type portion in the NPN structure of the two-layer graphene 3 to a desired P type. When the lower layer 2 is formed of two kinds of molecular materials, a first lower layer and a second lower layer can be formed by patterning in the same manner as that of a lower layer 21 in a second embodiment to be described later.

As for the molecular materials of the upper layer 6 (upper-side material), for the material of the P-type dopant molecule of the first upper layer 6a, $F_4$-TCNQ or $F_2$-HCNQ is used.

For the material of the N-type dopant molecule of the second upper layer 6b, one kind selected from among PEI, ferrocene, cobaltocene, and TTF is used. Incidentally, as the second upper layer 6b, a material of P-type dopant molecules with a property as the P-type dopant weaker than that as the N-type dopant of the lower-side material, for example, TCNQ may also be used.

For the electrode material of the source electrode 4 and the drain electrode 5, a conductive material that hardly modulates an electronic state of the N-type portion of the two-layer graphene 3, for example, one kind of a metal material of Ti, Zr, Hf, V, Ta, Se, Y, and La is used. In this embodiment, as described above, Ti is formed relatively thickly, (which is 20 nm or so), as the electrode material, to thereby function as a conductive material that hardly modulates an electronic state of the N-type portion of the two-layer graphene 3.

As explained above, according to this embodiment, there is fabricated a highly reliable graphene transistor having an NPN structure that includes a band gap formed by the molecular materials and uses a nanocarbon material as a channel with a relatively simple structure.

Modified Example

In this example, a graphene transistor is disclosed similarly to the first embodiment, but is different from the first embodiment in a point that the channel region is made into a PNP structure.

FIG. 3A to FIG. 4c are schematic cross-sectional views illustrating a method of manufacturing the graphene transistor according to a modified example of the first embodiment in order of processes.

Figure 3A:
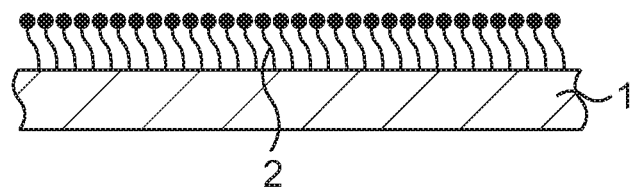
FIG. 3A is a schematic cross-sectional view illustrating a method of manufacturing a graphene transistor according to a modified example of the first embodiment in order of processes.
Figure 3B:
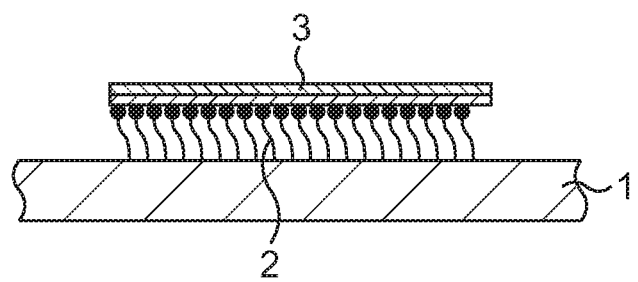
FIG. 3B is a schematic cross-sectional view illustrating, subsequent to FIG. 3A, the method of manufacturing the graphene transistor according to the modified example of the first embodiment in order of processes.

First, various processes similar to those of the first embodiment illustrated in FIG. 1A and FIG. 1B are performed in sequence. The states at this time are illustrated in FIG. 3A and FIG. 3B.

Figure 3C:
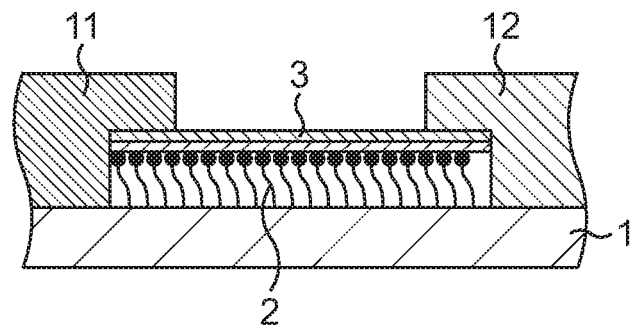
FIG. 3C is a schematic cross-sectional view illustrating, subsequent to FIG. 3B, the method of manufacturing the graphene transistor according to the modified example of the first embodiment in order of processes.

Subsequently, as illustrated in FIG. 3C, a source electrode 11 and a drain electrode 12 are formed so as to come into contact with both end portions of two-layer graphene 3.

In more detail, a resist is applied to the entire surface so as to cover a lower layer 2 and the two-layer graphene 3 and the resist is processed by photolithography to form an opening in forming regions of the source electrode and the drain electrode each. An electrode material is continuously deposited on the entire surface including the inside of the openings. As the electrode material, for example, Ti/Au (Ti for the lower layer) are used, and Ti is deposited into a thickness of 1 nm or so and is deposited into a thickness of 500 nm or so in sequence. Here, Ti is used as an adhesive layer of Au. Ti is formed very thinly, and thereby Au functions as a conductive material that hardly modulates an electronic state of the P-type portion of the two-layer graphene 3. By a lift-off method, the resist and Ti/Au thereon are removed. In this manner, the source electrode 11 and the drain electrode 12 being a pair of electrodes are formed so as to come into contact with the both end portions of the two-layer graphene 3.

Incidentally, in consideration of viewability of the drawing, illustration of the two-layer structure (Ti/Au) of the source electrode 11 and the drain electrode 12 is omitted.

Figure 4A:
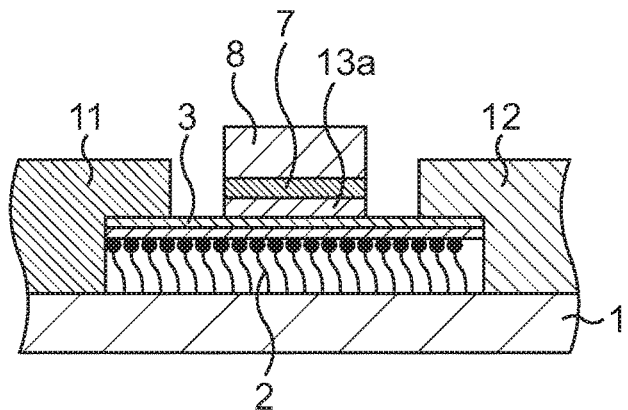
FIG. 4A is a schematic cross-sectional view illustrating, subsequent to FIG. 3C, the method of manufacturing the graphene transistor according to the modified example of the first embodiment in order of processes.

Subsequently, as illustrated in FIG. 4A, a gate electrode 8 is formed on the two-layer graphene 3 via a first upper layer 13a and a gate insulating film 7.

In more detail, first, a resist is applied to the entire surface so as to cover the two-layer graphene 3 and the resist is processed by photolithography to form an opening in a forming region of the gate electrode.

Next, as a molecular material, electron-donating N-type dopant molecules, which is PEI here, are deposited on the entire surface including the inside of the opening of the resist. PEI is deposited into a thickness of 2 nm or so, for example, by a vacuum deposition method, for example.

Next, an insulating material, for example, $HfO_2$ is deposited on the entire surface including the inside of the opening of the resist. $HfO_2$ is deposited into a thickness of 10 nm or so, for example, by an ALD method, for example.

Incidentally, the deposition of $HfO_2$ may also be performed by a plasma CVD method, a sputtering method, or the like, for example, in place of the ALD method. Further, instead of depositing $HfO_2$, a nitride or an oxynitride of Hf may also be used. Besides, an oxide, a nitride, or an oxynitride of Si, Al, Zr, Ti, Ta, W may be used or they may also be appropriately selected and deposited into multiple layers.

Next, an electrode material, which is Ti/Au, for example, is deposited on the entire surface including the inside of the opening of the resist by a vacuum deposition method or the like.

Then, by a lift-off method, the resist and PEI, $HfO_2$, and Ti/Au thereon are removed. Thus, there is formed a structure made by the first upper layer 13a made of PEI, the gate insulating film 7 made of $HfO_2$, and the gate electrode 8 made of Ti/Au being stacked in sequence on the two-layer graphene 3. Incidentally, in consideration of viewability of the drawing, illustration of the two-layer structure (Ti/Au) of the gate electrode 8 is omitted.

Figure 4B:
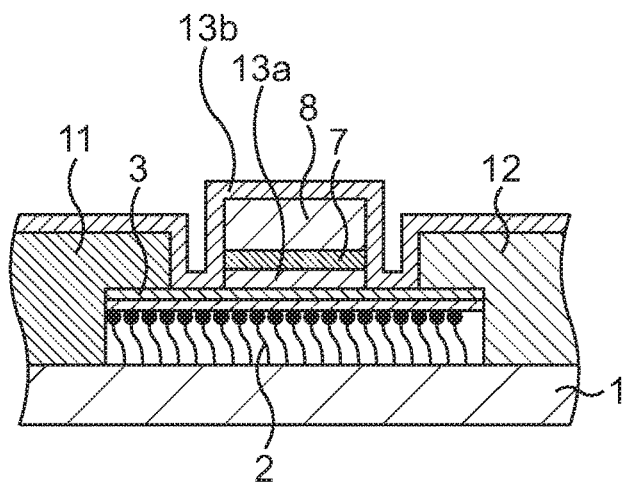
FIG. 4B is a schematic cross-sectional view illustrating, subsequent to FIG. 4A, the method of manufacturing the graphene transistor according to the modified example of the first embodiment in order of processes.

Subsequently, as illustrated in FIG. 4B, a second upper layer 13b is formed at both sides of the first upper layer 13a.

In more detail, on the entire surface including the surface of the two-layer graphene 3 exposed between the gate electrode 8 and the source electrode 11 and the surface of the two-layer graphene 3 exposed between the gate electrode 8 and the drain electrode 12, as a molecular material, electron-withdrawing (hole-donating) P-type dopant molecules, which are $F_4$-TCNQ here, are deposited. $F_4$-TCNQ is deposited into a thickness of 2 nm or so, for example, by a vacuum deposition method, for example. Thereby, the second upper layer 13b made of $F_4$-TCNQ is formed in a self-aligned manner at the both sides of the first upper layer 13a on the two-layer graphene 3.

Figure 4C:
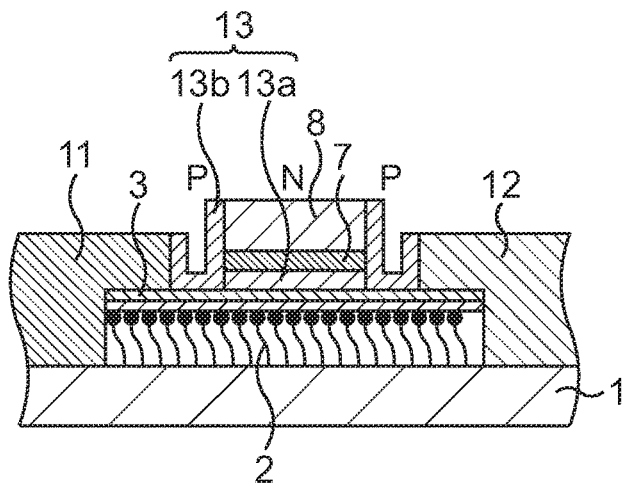
FIG. 4C is a schematic cross-sectional view illustrating, subsequent to FIG. 4B, the method of manufacturing the graphene transistor according to the modified example of the first embodiment in order of processes.

Subsequently, as illustrated in FIG. 4C, only the upper layer 13b between the gate electrode 8 and the source electrode 11 and the upper layer 13b between the gate electrode 8 and the drain electrode 12 are left.

In more detail, the entire surface of the upper layer 13b is anisotropically dry-etched (etched back). Thereby, the upper layer 13b on the source electrode 11, the upper layer 13b on the drain electrode 12, and the upper layer 13b on the gate electrode 8 are removed, and the second upper layer 13b is left only between the gate electrode 8 and the source electrode 11 and between the gate electrode 8 and the drain electrode 12. Thus, an upper layer 13 constituted of the first upper layer 13a and the second upper layer 13b covering the region between the source electrode 11 and the drain electrode 12 on the two-layer graphene 3 is constituted.

Thereafter, by going through various processes of formation of wiring connected to the source electrode 11, the drain electrode 12, and the gate electrode 8, formation of a protective film, and the like, the graphene transistor is formed.

In the graphene transistor according to this example, the lower layer 2 is formed under the two-layer graphene 3 and the upper layer 13 is formed on the two-layer graphene 3 so as to sandwich the two-layer graphene 3. The lower layer 2 is formed of $N(CH_3)_2$-SAM being the electron-donating N-type dopant molecule. The upper layer 13 is constituted by the first upper layer 13a made of PEI being the electron-donating N-type dopant molecule and formed in a portion below the gate electrode 8 and the second upper layer 13b made of $F_4$-TCNQ being the electron-withdrawing (hole-donating) P-type dopant molecule and formed at the both side portions of the gate electrode 8.

The two-layer graphene 3 is sandwiched between the lower layer 2 being the N-type dopants for the two-layer graphene 3 and the first upper layer 13a being the N-type dopants for the two-layer graphene 3 similarly in the region aligned below the gate electrode 8. In this case, although the two-layer graphene 3 becomes an N type in the region, a band gap is formed due to the difference in electron donating property between the upper and lower molecular materials.

In the meantime, of the two-layer graphene 3, the regions aligned with the both sides of the gate electrode 8 are each sandwiched between the lower layer 2 being the N-type dopants for the two-layer graphene 3 and the second upper layer being the P-type dopants for the two-layer graphene 3. In this case, the property as the P-type dopant of the second upper layer 13b is stronger than that as the N-type dopant of the lower layer 2. Therefore, the two-layer graphene 3 becomes a P type as a whole in the regions while forming a band gap.

As above, in the graphene transistor in this example, the two-layer graphene 3 substantially becomes a PNP structure in the channel region between the source electrode 11 and the drain electrode 12, and a sufficient band gap is formed.

In this example, when forming the first upper layer 13a and the second upper layer 13b constituting the upper layer 13, the rate of these to cover the two-layer graphene 3 is adjusted, thereby making it possible to control individual conductivity-type doping states (concentrations) of P, N, and P in the PNP structure.

In this example, as the N-type dopant molecule, $N(CH_3)_2$-SAM and PEI are cited, and as the P-type dopant molecule, $F_4$-TCNQ is cited, but these are one example.

In the graphene transistor having an PNP structure according to this example, the molecular material of the lower layer 2, the molecular materials of the first upper layer 13a and the second upper layer 13b constituting the upper layer 13, and the electrode material of the source electrode 11 and the drain electrode 12 can be selected as follows.

TABLE 3

| | PNP STRUCTURE CASE | | |
|---|---|---|---|
| | P | N | P |
| UPPER-SIDE MATERIAL | $F_4$—TCNQ/ $F_2$—HCNQ | PEI/TCNQ/ FERROCENE/ COBALTOCENE/ TTF | $F_4$—TCNQ/ $F_2$—HCNQ |

TABLE 3-continued

PNP STRUCTURE CASE

| | P | N | P |
|---|---|---|---|
| LOWER-SIDE MATERIAL | $NH_2$—SAM/ $NH(CH_3)$—SAM/ $N(CH_3)_2$—SAM/ ALKYLSILANE FLUORIDE | $NH_2$—SAM/ $NH(CH_3)$—SAM/ $N(CH_3)_2$—SAM | $NH_2$—SAM/ $NH(CH_3)$—SAM/ $N(CH_3)_2$—SAM/ ALKYLSILANE FLUORIDE |

ELECTRODE MATERIAL: Au, Pd, Pt, Ni, Co, Ir

For the material of the N-type dopant molecule of the lower layer 2 (lower-side material), one kind selected from among $NH_2$-SAM, $NH(CH_3)$-SAM, and $N(CH_3)_2$-SAM is used.

Incidentally, it is also possible that the above-described selected one kind is formed in a portion positioned lower in the first upper layer 13a and the P-type dopant molecule, for example, alkylsilane fluoride is formed in portions positioned lower in the second upper layer 13b. This makes it possible to securely adjust the P-type portion in the PNP structure of the two-layer graphene 3 to a desired P type. When the lower layer 2 is formed of two kinds of molecular materials, a first lower layer and a second lower layer can be formed by patterning in the same manner as that of a lower layer 21 in a second embodiment to be described later.

As for the molecular materials of the upper layer 13 (upper-side material), for the material of the N-type dopant molecule of the first upper layer 13a, one kind selected from among PEI, ferrocene, cobaltocene, and TTF is used. Incidentally, as the first upper layer 13a, a material of P-type dopant molecules with a property as the P-type dopant weaker than that as the N-type dopant of the lower-side material, for example, TCNQ may also be used.

For the material of the P-type dopant molecule of the second upper layer 13b, $F_4$-TCNQ or $F_2$-HCNQ is used.

For the electrode material of the source electrode 11 and the drain electrode 12, a conductive material that hardly modulates an electronic state of the P-type portion of the two-layer graphene 3, for example, one kind of a metal material of Au, Pd, Pt, Ni, Co, and Ir is used. In this example, as described above, Ti is formed very thinly, (which is 1 nm or so), as an adhesive layer, and thereby Au functions as a conductive material that hardly modulates an electronic state of the P-type portion of the two-layer graphene 3.

As explained above, according to this example, there is fabricated a highly reliable graphene transistor having a PNP structure that includes a band gap formed by the molecular materials and uses a nanocarbon material as a channel with a relatively simple structure.

Second Embodiment

In this embodiment, there is disclosed a tunnel transistor using graphene for a channel material (graphene tunnel transistor). In this embodiment, a constitution of the graphene tunnel transistor is explained together with its manufacturing method.

FIG. 5A to FIG. 6C are schematic cross-sectional views illustrating the method of manufacturing the graphene tunnel transistor according to a second embodiment in order of processes.

Figure 5A:
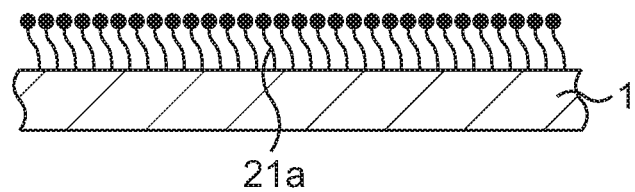
FIG. 5A is schematic cross-sectional view illustrating a method of manufacturing a graphene transistor according to a second embodiment in order of processes.

First, as illustrated in FIG. 5A, a first lower layer 21a is formed on a substrate 1 by a gas phase method.

In more detail, the substrate 1, here, a Si substrate is prepared, and on the Si substrate, a silicon oxide film is formed by thermal oxidation or the like. The substrate 1 and as a molecular material, electron-donating N-type dopant molecules put in an open container, which are N-dimethyl-3-aminopropylmethoxysilane here, are sealed in an airtight container made of Teflon (registered trademark) in a glove box under an atmospheric pressure. Then, the airtight container is placed in an electric furnace and subjected to heat treatment for several hours or so. The heating temperature is set to, for example, 100° C. By the heat treatment, a SAM film of N-dimethyl-3-aminopropylmethoxysilane is formed on the silicon oxide film of the substrate 1.

Next, the formed SAM film is subjected to various treatments. Specifically, a toluene treatment and an ethanol treatment are performed for 10 minutes or so each in sequence. Thereafter, a blow treatment is performed with $N_2$.

Thus, the first lower layer 21a being the SAM film of N-dimethyl-3-aminopropylmethoxysilane is formed.

Figure 5B:
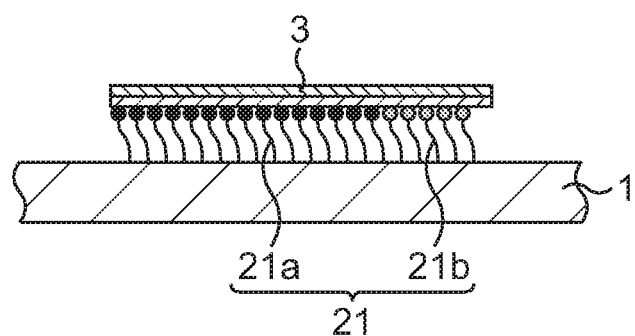
FIG. 5B is a schematic cross-sectional view illustrating, subsequent to FIG. 5A, the method of manufacturing the graphene transistor according to the second embodiment in order of processes.

Subsequently, as illustrated in FIG. 5B, a second lower layer 21b constituting a lower layer 21 together with the first lower layer 21a is formed, two-layer graphene 3 is formed by transfer on the lower layer 21, and the lower layer 21 and the two-layer graphene 3 are processed.

In more detail, first, by lithography and etching, the lower layer 21a is processed to remove a part of the lower layer 21a.

Next, on the silicon oxide film of the substrate 1 exposed by removing the lower layer 21a partly, electron-withdrawing (hole-donating) P-type dopant molecules, which are N-phenyl-3-aminotrimethoxysilane here, are deposited as a SAM film by a gas phase method used similarly when the lower layer 21a is formed. Thus, the second lower layer 21b being the SAM film of alkylsilane fluoride is formed on the substrate 1 so as to be adjacent to the first lower layer 21a. The lower layer 21 is constituted by the first lower layer 21a and the second lower layer 21b.

The two-layer graphene may be transferred from graphite crystals using a peeling method with an adhesive tape (see Non-Patent Document 2), or one obtained by a CVD method may also be transferred (see Non-Patent Document 3).

Next, the transferred graphene and the lower layer 21 are appropriately processed by lithography and etching. Dry etching using oxygen plasma and/or the like, for example, is used for the etching of the graphene. Dry etching using oxygen plasma or UV ozone, for example, is used for the etching of the lower layer 21. Thus, the two-layer graphene 3 constituting a channel region is formed on the lower layer 21.

Figure 5C:
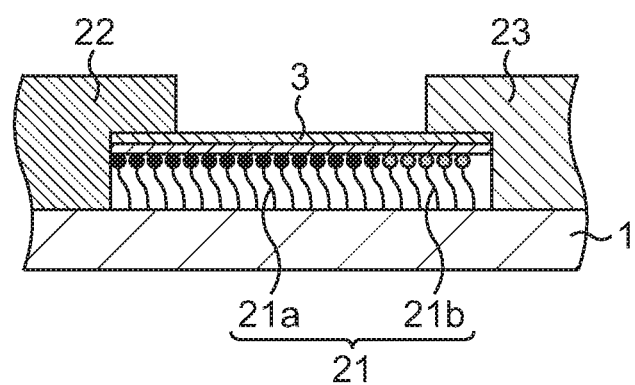
FIG. 5C is a schematic cross-sectional view illustrating, subsequent to FIG. 5B, the method of manufacturing the graphene transistor according to the second embodiment in order of processes.

Subsequently, as illustrated in FIG. 5C, a source electrode 22 and a drain electrode 23 are formed so as to come into contact with both end portions of the two-layer graphene 3.

In more detail, first, a resist is applied to the entire surface so as to cover the lower layer 21 and the two-layer graphene 3 and the resist is processed by photolithography to form an opening in a forming region of the source electrode. An electrode material is continuously deposited on the entire surface including the inside of the opening. As the electrode material, for example, Ti/Au (Ti for the lower layer) are used, and Ti is deposited into a thickness of 20 nm or so and Au is deposited into a thickness of 500 nm or so in sequence. Ti is formed relatively thickly, to thereby function as a conductive material that hardly modulates an electronic state of the N-type portion of the two-layer graphene 3. By a lift-off method, the resist and Ti and Au thereon are removed. Thus, the source electrode 22 is formed so as to come into contact with one of the end portions of the two-layer graphene 3.

Incidentally, in consideration of viewability of the drawing, illustration of the two-layer structure (Ti/Au) of the source electrode 22 is omitted.

Next, a resist is applied to the entire surface so as to cover the lower layer 21 and the two-layer graphene 3 and the resist is processed by photolithography to form an opening in a forming region of the drain electrode. An electrode material is continuously deposited on the entire surface including the inside of the opening. As the electrode material, for example, Ti/Pt (Ti for the lower layer) are used, and Ti is deposited into a thickness of 1 nm or so and is deposited into a thickness of 500 nm or so in sequence. Here, Ti is used as an adhesive layer of Pt. Ti is formed very thinly, and thereby Pt functions as a conductive material that hardly modulates an electronic state of the P-type portion of the two-layer graphene 3. By a lift-off method, the resist and Ti/Pt thereon are removed. Thus, the drain electrode 23 is formed so as to come into contact with the other of the end portions of the two-layer graphene 3.

Incidentally, in consideration of viewability of the drawing, illustration of the two-layer structure (Ti/Pt) of the drain electrode 23 is omitted.

Figure 6A:
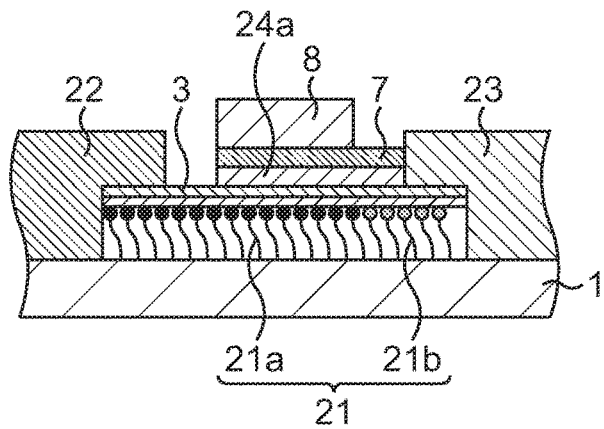
FIG. 6A is a schematic cross-sectional view illustrating, subsequent to FIG. 5C, the method of manufacturing the graphene transistor according to the second embodiment in order of processes.

Subsequently, as illustrated in FIG. 6A, a gate electrode 8 is formed on the two-layer graphene 3 via a first upper layer 24*a* and a gate insulating film 7.

In more detail, first, a resist is applied to the entire surface so as to cover the two-layer graphene 3 and the resist is processed by photolithography to form an opening in a region of the region between the source electrode 22 and the drain electrode 23 from which the region adjacent to the source electrode 22 is excluded.

Next, on the entire surface including the inside of the opening of the resist, as a molecular material, electron-withdrawing (hole-donating) P-type dopant molecules, which are $F_4$-TCNQ here, are deposited. $F_4$-TCNQ is deposited into a thickness of 2 nm or so, for example, by a vacuum deposition method, for example.

Next, polyvinyl alcohol (PVA) is deposited into a thickness of several nanometers or so by a spin coat method or a dip method. Using PVA as a seed layer, an insulating material, for example, $HfO_2$ is deposited on the entire surface including the inside of the opening of the resist. $HfO_2$ is deposited into a thickness of 10 nm or so, for example, by an ALD method, for example.

Incidentally, the deposition of $HfO_2$ may also be performed by a plasma CVD method, a sputtering method, or the like, for example, in place of the ALD method. Further, instead of depositing $HfO_2$, a nitride or an oxynitride of Hf may also be used. Besides, an oxide, a nitride, or an oxynitride of Si, Al, Zr, Ti, Ta, W may be used or they may also be appropriately selected and deposited into multiple layers.

Then, by a lift-off method, the resist and PVA, $F_4$-TCNQ, and $HfO_2$ thereon are removed. Thus, there is formed a structure made by the first upper layer 24*a* made of $F_4$-TCNQ and the gate insulating film 7 made of $HfO_2$ being stacked in sequence on the two-layer graphene 3.

Next, a resist is applied to the entire surface and the resist is processed by photolithography to form an opening in a forming region of the gate electrode.

Next, an electrode material, which is Ti/Au, for example, is deposited on the entire surface including the inside of the opening of the resist by a vacuum deposition method or the like.

Then, by a lift-off method, the resist and Ti/Au thereon are removed. Thus, the gate electrode 8 is formed on the two-layer graphene 3 via the structure of the first upper layer 24*a* and the gate insulating film 7. Incidentally, in consideration of viewability of the drawing, illustration of the two-layer structure (Ti/Au) of the gate electrode 8 is omitted.

Figure 6B:
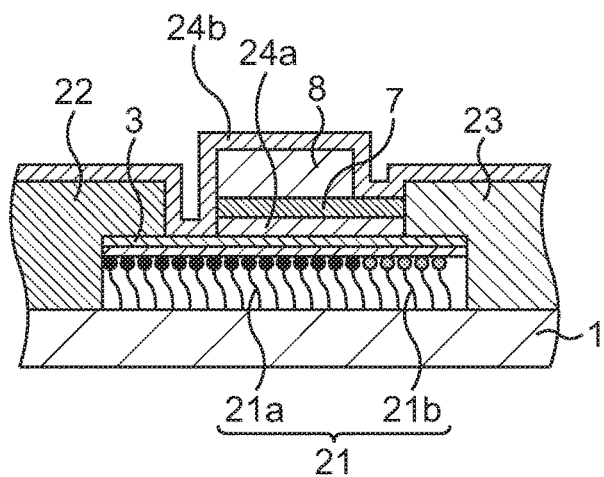
FIG. 6B is a schematic cross-sectional view illustrating, subsequent to FIG. 6A, the method of manufacturing the graphene transistor according to the second embodiment in order of processes.

Subsequently, as illustrated in FIG. 6B, a second upper layer 24*b* is formed in a region between the source electrode 22 and the first upper layer 24*a*.

In more detail, on the entire surface including the surface of the two-layer graphene 3 exposed between the source electrode 22 and the first upper layer 24*a*, as a molecular material, electron-donating N-type dopant molecules, which are PEI here, are deposited. PEI is deposited into a thickness of 2 nm or so, for example, by a vacuum deposition method, for example. Thereby, the second upper layer 24*b* made of PEI is formed in a self-aligned manner in the region between the source electrode 22 and the first upper layer 24*a* on the two-layer graphene 3.

Figure 6C:
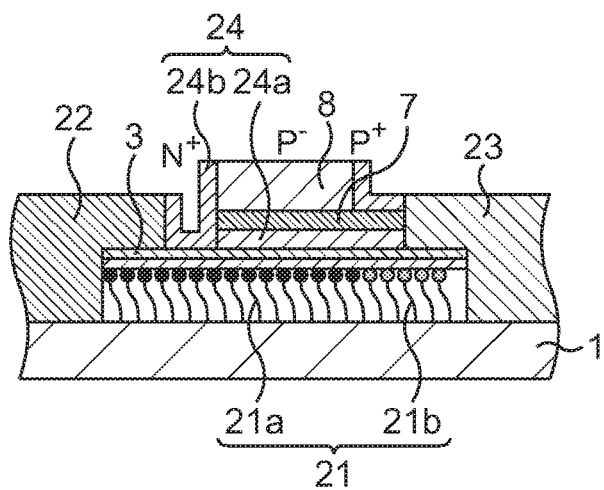
FIG. 6C is a schematic cross-sectional view illustrating, subsequent to FIG. 6B, the method of manufacturing the graphene transistor according to the second embodiment in order of processes.

Subsequently, as illustrated in FIG. 6C, only the upper layer 24*b* between the gate electrode 8 and the source electrode 22 is left.

In more detail, the entire surface of the upper layer 24*b* is anisotropically dry-etched (etched back). Thereby, the upper layer 24*b* on the source electrode 22, the upper layer 24*b* on the drain electrode 23, and the upper layer 24*b* on the gate electrode 8 are removed, and the second upper layer 24*b* is left only between the gate electrode 8 and the source electrode 22. Thus, an upper layer 24 constituted of the first upper layer 24*a* and the second upper layer 24*b* covering the region between the source electrode 22 and the drain electrode 23 on the two-layer graphene 3 is constituted.

Thereafter, by going through various processes of formation of wiring connected to the source electrode 22, the drain electrode 23, and the gate electrode 8, formation of a protective film, and the like, the graphene tunnel transistor is formed.

In the graphene tunnel transistor according to this embodiment, the lower layer 21 is formed under the two-layer graphene 3 and the upper layer 24 is formed on the two-layer graphene 3 so as to sandwich the two-layer graphene 3. The lower layer 21 is constituted by the first lower layer 21*a* made of N-dimethyl-3-aminopropylmethoxysilane being the electron-donating N-type dopant molecule and formed ranging from below the gate electrode 8 to the source electrode 22 and the second lower layer 21*b* made of alkylsilane fluoride being the electron-withdrawing (hole-donating) P-type dopant molecule and formed between the gate electrode 8 and the drain electrode 23. The upper layer 24 is constituted by the first upper layer 24*a* made of $F_4$-TCNQ being the electron-withdrawing (hole-donating) P-type dopant molecule and formed ranging from below the gate electrode 8 to the drain electrode 23 and the second upper layer 24*b* made of PEI being the electron-donating N-type dopant molecule and formed between the gate electrode 8 and the source electrode 22.

The two-layer graphene 3 is sandwiched between the first lower layer 21*a* being the N-type dopants for the two-layer graphene 3 and the first upper layer 24*a* being the P-type dopants for the two-layer graphene 3 in the region aligned below the gate electrode 8. In this case, the property as the P-type dopant of the first upper layer 24*a* is stronger than that as the N-type dopant of the first lower layer 21*a*. Therefore, the two-layer graphene 3 becomes a P type as a whole in the region while forming a band gap.

In the meantime, of the two-layer graphene 3, the region positioned between the gate electrode 8 and the source electrode 22 is sandwiched between the first lower layer 21*a* being the N-type dopants for the two-layer graphene 3 and the second upper layer 24*b* being the N-type dopants for the two-layer graphene 3 similarly. In this case, although the two-layer graphene 3 becomes an $N^+$ type in the region, a band gap is formed due to the difference in electron donating property between the upper and lower molecular materials.

In the meantime, of the two-layer graphene 3, the region positioned between the gate electrode 8 and the drain electrode 23 is sandwiched between the second lower layer 21b being the P-type dopants for the two-layer graphene 3 and the first upper layer 24a being the P-type dopants for the two-layer graphene 3 similarly. In this case, although the two-layer graphene 3 becomes a $P^+$ type in the region, a band gap is formed due to the difference in electron withdrawing property between the upper and lower molecular materials.

As above, in the graphene tunnel transistor in this embodiment, the two-layer graphene 3 substantially becomes an $N^+P^-P^+$ structure in the channel region between the source electrode 22 and the drain electrode 23, and a sufficient band gap is formed.

In this embodiment, when forming the first upper layer 24a and the second upper layer 24b constituting the upper layer 24, the rate of these to cover the two-layer graphene 3 is adjusted, thereby making it possible to control individual conductivity-type doping states (concentrations) of $N^+$, $P^-$, and $P^+$ in the $N^+P^-P^+$ structure.

In this embodiment, as the N-type dopant molecule, N-dimethyl-3-aminopropylmethoxysilane and PEI are cited, and as the P-type dopant molecule, $F_4$-TCNQ and alkylsilane fluoride are cited, but these are one example.

In the graphene tunnel transistor having an $N^+P^-P^+$ structure according to this embodiment, the molecular materials of the first lower layer 21a and the second lower layer 21b constituting the lower layer 21, the molecular materials of the first upper layer 24a and the second upper layer 24b constituting the upper layer 24, and the electrode materials of the source electrode 22 and the drain electrode 23 can be selected as follows.

For the material of the N-type dopant molecule of the second upper layer 24b, one kind selected from among PEI, ferrocene, cobaltocene, and TTF is used.

For the electrode material of the source electrode 22, a conductive material that hardly modulates an electronic state of the N-type portion of the two-layer graphene 3, for example, one kind of a metal material of Ti, Zr, Hf, V, Ta, Se, Y, and La is used. In this embodiment, as described above, Ti is formed relatively thickly, (which is 20 nm or so), as the electrode material, to thereby function as a conductive material that hardly modulates an electronic state of the N-type portion of the two-layer graphene 3.

For the electrode material of the drain electrode 23, a conductive material that hardly modulates an electronic state of the P-type portion of the two-layer graphene 3, for example, one kind of a metal material of Au, Pd, Pt, Ni, Co, and Ir is used. In this embodiment, as described above, Ti is formed very thinly, (which is 1 nm or so), as an adhesive layer, and thereby Pt functions as a conductive material that hardly modulates an electronic state of the P-type portion of the two-layer graphene 3.

As explained above, according to this embodiment, there is fabricated a highly reliable graphene tunnel transistor having an $N^+P^-P^+$ structure that includes a band gap formed by the molecular materials and uses a nanocarbon material as a channel with a relatively simple structure.

Modified Example

In this example, a graphene tunnel transistor is disclosed similarly to the second embodiment, but is different from the second embodiment in a point that the channel region is made into a $P^+N^-N^+$ structure.

FIG. 7A to FIG. 8c are schematic cross-sectional views illustrating a method of manufacturing the graphene tunnel transistor according to a modified example of the second embodiment in order of processes.

TABLE 4

| | $N^+P^-P^+$ STRUCTURE CASE | | |
|---|---|---|---|
| | $N^+$ | $P^-$ | $P^+$ |
| UPPER-SIDE MATERIAL | PEI/ FERROCENE/ COBALTOCENE/ TTF | $F_4$—TCNQ/ $F_2$—HCNQ | $F_4$—TCNQ/ $F_2$—HCNQ |
| LOWER-SIDE MATERIAL | $NH_2$—SAM/ $NH(CH_3)$—SAM/ $N(CH_3)_2$—SAM | $NH_2$—SAM/ $NH(CH_3)$—SAM/ $N(CH_3)_2$—SAM | ALKYLSILANE FLUORIDE, N-PHENYL-3-AMINOTRIMETHOXYSILANE, 3-MERCAPTOTRIMETHOXYSILANE AND SO ON, p-TYPE DOPANT SAM |

ELECTRODE MATERIAL: $n^+$ SIDE: Ti, Zr, Hf, V, Ta, Sc, Y, La $p^+$ SIDE: Au, Pd, Pt, Ni, Co, Ir

As for the molecular materials of the lower layer 21 (lower-side material), for the material of the N-type dopant molecule of the first lower layer 21a, one kind selected from among $NH_2$-SAM, $NH(CH_3)$-SAM, and $N(CH_3)_2$-SAM is used.

For the material of the P-type dopant molecule of the second lower layer 21b, one kind selected from among alkylsilane fluoride, N-phenyl-3-aminotrimethoxysilane, 3-mercaptotrimethoxysilane, and so on is used.

As for the molecular materials of the upper layer 24 (upper-side material), for the material of the P-type dopant molecule of the first upper layer 24a, $F_4$-TCNQ or $F_2$-HCNQ is used.

Figure 7A:
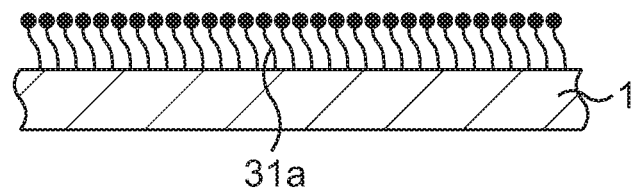
FIG. 7A is a schematic cross-sectional view illustrating a method of manufacturing a graphene transistor according to a modified example of the second embodiment in order of processes.

First, processes similar to those of the second embodiment illustrated in FIG. 5A are performed. At this time, as illustrated in FIG. 7A, a first lower layer 31a being a SAM film of N-dimethyl-3-aminopropylmethoxysilane is formed on a silicon oxide film of a substrate 1.

Figure 7B:
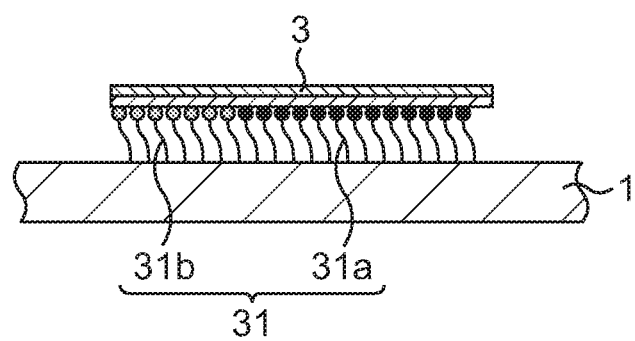
FIG. 7B is a schematic cross-sectional view illustrating, subsequent to FIG. 7A, the method of manufacturing the graphene transistor according to the modified example of the second embodiment in order of processes.

Subsequently, as illustrated in FIG. 7B, a second lower layer 31b to constitute a lower layer 31 together with the first lower layer 31a is formed, two-layer graphene 3 is formed by transfer on the lower layer 31, and the lower layer 31 and the two-layer graphene 3 are processed.

In more detail, first, by lithography and etching, the lower layer 31a is processed to remove a part of the lower layer 31a.

Next, on the silicon oxide film of the substrate 1 exposed by removing the lower layer 31a partly, electron-withdrawing (hole-donating) P-type dopant molecules, which are alkylsilane fluoride here, are deposited as a SAM film by a gas phase method used similarly when the lower layer 31a is formed. Thus, the second lower layer 31b being the SAM film of alkylsilane fluoride is formed so as to be adjacent to the first lower layer 31a on the substrate 1. The lower layer 31 is constituted by the first lower layer 31a and the second lower layer 31b.

The two-layer graphene may be transferred from graphite crystals using a peeling method with an adhesive tape (see Non-Patent Document 2), or one obtained by a CVD method may also be transferred (see Non-Patent Document 3).

Next, the transferred graphene and the lower layer 31 are appropriately processed by lithography and etching. Dry etching using oxygen plasma or UV ozone, for example, is used for the etching of the graphene. Dry etching using oxygen plasma and UV ozone, for example, is used for the etching of the lower layer 31. Thus, the two-layer graphene 3 constituting a channel region is formed on the lower layer 31.

Figure 7C:
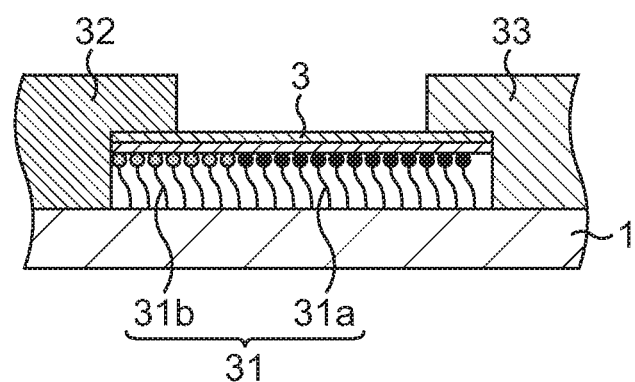
FIG. 7C is a schematic cross-sectional view illustrating, subsequent to FIG. 7B, the method of manufacturing the graphene transistor according to the modified example of the second embodiment in order of processes.

Subsequently, as illustrated in FIG. 7C, a source electrode 32 and a drain electrode 33 are formed so as to come into contact with both end portions of the two-layer graphene 3.

In more detail, first, a resist is applied to the entire surface so as to cover the lower layer 31 and the two-layer graphene 3 and the resist is processed by photolithography to form an opening in a forming region of the source electrode. An electrode material is continuously deposited on the entire surface including the inside of the opening. As the electrode material, for example, Ti/Pt (Ti for the lower layer) are used, and Ti is deposited into a thickness of 1 nm or so and is deposited into a thickness of 500 nm or so in sequence. Ti is used as an adhesive layer of Pt here. Ti is formed very thinly, and thereby Pt functions as a conductive material that hardly modulates an electronic state of the P-type portion of the two-layer graphene 3. By a lift-off method, the resist and Ti/Pt thereon are removed. Thus, the source electrode 32 is formed so as to come into contact with one of the end portions of the two-layer graphene 3.

Incidentally, in consideration of viewability of the drawing, illustration of the two-layer structure (Ti/Pt) of the source electrode 32 is omitted.

Next, a resist is applied to the entire surface so as to cover the lower layer 31 and the two-layer graphene 3 and the resist is processed by photolithography to form an opening in a forming region of the drain electrode. An electrode material is continuously deposited on the entire surface including the inside of the opening. As the electrode material, for example, Ti/Au (Ti for the lower layer) are used, and Ti is deposited into a thickness of 20 nm or so and Au is deposited into a thickness of 500 nm or so in sequence. Ti is formed relatively thickly, to thereby function as a conductive material that hardly modulates an electronic state of the N-type portion of the two-layer graphene 3. By a lift-off method, the resist and Ti and Au thereon are removed. Thus, the drain electrode 33 is formed so as to come into contact with the other of the end portions of the two-layer graphene 3.

Incidentally, in consideration of viewability of the drawing, illustration of the two-layer structure (Ti/Au) of the drain electrode 33 is omitted.

Figure 8A:
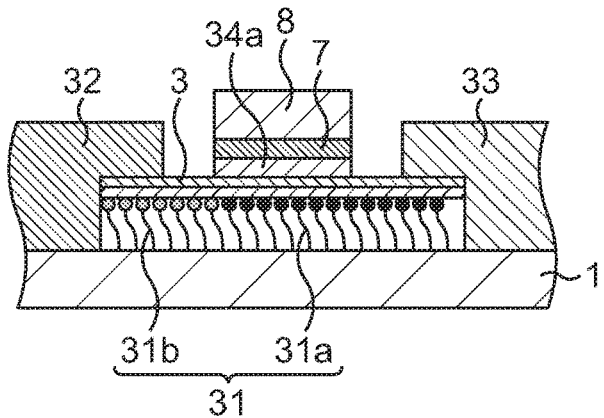
FIG. 8A is a schematic cross-sectional view illustrating, subsequent to FIG. 7C, the method of manufacturing the graphene transistor according to the modified example of the second embodiment in order of processes.

Subsequently, as illustrated in FIG. 8A, a gate electrode 8 is formed on the two-layer graphene 3 via a first upper layer 34a and a gate insulating film 7.

In more detail, first, a resist is applied to the entire surface so as to cover the two-layer graphene 3 and the resist is processed by photolithography to form an opening in a forming region of the gate electrode.

Next, on the entire surface including the inside of the opening of the resist, as a molecular material, electron-withdrawing (hole-donating) P-type dopant molecules, which are TCNQ here, are deposited. TCNQ is deposited into a thickness of 2 nm or so, for example, by a vacuum deposition method, for example.

Next, polyvinyl alcohol (PVA) is deposited into a thickness of several nanometers or so by a spin coat method or a dip method. Using PVA as a seed layer, an insulating material, for example, $HfO_2$ is deposited on the entire surface including the inside of the opening of the resist. $HfO_2$ is deposited into a thickness of 10 nm or so, for example, by an ALD method, for example.

Incidentally, the deposition of $HfO_2$ may also be performed by a plasma CVD method, a sputtering method, or the like, for example, in place of the ALD method. Further, instead of depositing $HfO_2$, a nitride or an oxynitride of Hf may also be used. Besides, an oxide, a nitride, or an oxynitride of Si, Al, Zr, Ti, Ta, W may be used or they may also be appropriately selected and deposited into multiple layers.

Next, an electrode material, which is Ti/Au, for example, is deposited on the entire surface including the inside of the opening of the resist by a vacuum deposition method or the like.

Then, by a lift-off method, the resist and TCNQ, $HfO_2$, and Ti/Au thereon are removed. Thus, on the two-layer graphene 3, there is formed a structure made by the first upper layer 34a made of TCNQ, the gate insulating film 7 made of $HfO_2$, and the gate electrode 8 made of Ti/Au being stacked in sequence. Incidentally, in consideration of viewability of the drawing, illustration of the two-layer structure (Ti/Au) of the source electrode 8 is omitted.

Figure 8B:
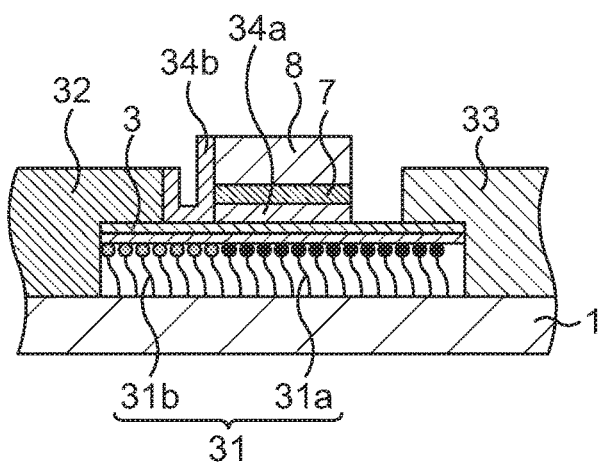
FIG. 8B is a schematic cross-sectional view illustrating, subsequent to FIG. 8A, the method of manufacturing the graphene transistor according to the modified example of the second embodiment in order of processes.

Subsequently, as illustrated in FIG. 8B, a second upper layer 34b is formed in a region between the source electrode 32 and the first upper layer 34a.

In more detail, first, a resist is applied to the entire surface and the resist is processed by photolithography to form an opening in a region between the gate electrode 8 and the source electrode 32.

Next, on the entire surface including the inside of the opening of the resist, as a molecular material, electron-withdrawing (hole-donating) P-type dopant molecules, which are $F_4$-TCNQ here, are deposited. $F_4$-TCNQ is deposited into a thickness of 2 nm or so, for example, by a vacuum deposition method, for example.

Then, by a lift-off method, the resist and $F_4$-TCNQ thereon are removed. Thus, the second upper layer 34b made of $F_4$-TCNQ is formed on the two-layer graphene 3 so as to come into contact with the first upper layer 34a.

Figure 8C:
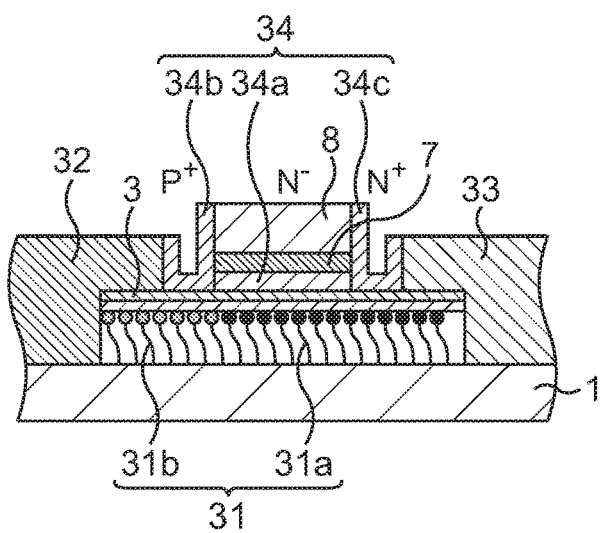
FIG. 8C is a schematic cross-sectional view illustrating, subsequent to FIG. 8B, the method of manufacturing the graphene transistor according to the modified example of the second embodiment in order of processes.

Subsequently, as illustrated in FIG. 8C, a third upper layer 34c is formed in a region between the drain electrode 33 and the first upper layer 34a.

In more detail, first, a resist is applied to the entire surface and the resist is processed by photolithography to form an opening in a region between the gate electrode 8 and the drain electrode 33.

Next, on the entire surface including the inside of the opening of the resist, as a molecular material, electron-donating N-type dopant molecules, which are PEI here, are deposited. PEI is deposited into a thickness of 2 nm or so, for example, by a vacuum deposition method, for example. Thereby, the third upper layer 34c made of PEI is formed in the region between the drain electrode 33 and the first upper layer 34a on the two-layer graphene 3.

Thus, an upper layer 34 constituted of the first upper layer 34a, the second upper layer 34b, and the third upper layer 34c covering the region between the source electrode 32 and the drain electrode 33 on the two-layer graphene 3 is constituted.

Thereafter, by going through various processes of formation of wiring connected to the source electrode 32, the drain electrode 33, and the gate electrode 8, formation of a protective film, and the like, the graphene tunnel transistor is formed.

In the graphene tunnel transistor according to this example, the lower layer 31 is formed under the two-layer graphene 3 and the upper layer 34 is formed on the two-layer graphene 3 so as to sandwich the two-layer graphene 3. The lower layer 31 is constituted by the first lower layer 31a made of N-dimethyl-3-aminopropylmethoxysilane being the electron-donating N-type dopant molecule and formed ranging from below the gate electrode 8 to the drain electrode 33 and the second lower layer 31b made of alkylsilane fluoride being the electron-withdrawing (hole-donating) P-type dopant molecule and formed between the gate electrode 8 and the drain electrode 32. The upper layer 34 is constituted by the first upper layer 34a made of TCNQ being the electron-withdrawing (hole-donating) P-type dopant molecule and formed below the gate electrode 8, the second upper layer 34b made of $F_4$-TCNQ being the electron-withdrawing (hole-donating) P-type dopant molecule and formed between the gate electrode 8 and the source electrode 32, and the third upper layer 34c made of PEI being the electron-donating N-type dopant molecule and formed between the gate electrode 8 and the drain electrode 33.

The two-layer graphene 3 is sandwiched between the first lower layer 31a being the N-type dopants for the two-layer graphene 3 and the first upper layer 34a being the P-type dopants for the two-layer graphene 3 in the region aligned below the gate electrode 8. In this case, the property as the N-type dopant of the first lower layer 31a is stronger than that as the P-type dopant of the first upper layer 34a. Therefore, the two-layer graphene 3 becomes an $N^-$ type as a whole in the region while forming a band gap.

In the meantime, of the two-layer graphene 3, the region positioned between the gate electrode 8 and the source electrode 32 is sandwiched between the second lower layer 31b being the P-type dopants for the two-layer graphene 3 and the second upper layer 34b being the P-type dopants for the two-layer graphene 3 similarly. In this case, although the two-layer graphene 3 becomes a $P^+$ type in the region, a band gap is formed due to the difference in electron withdrawing property between the upper and lower molecular materials.

In the meantime, of the two-layer graphene 3, the region positioned between the gate electrode 8 and the drain electrode 33 is sandwiched between the first lower layer 31a being the N-type dopants for the two-layer graphene 3 and the third upper layer 34c being the N-type dopants for the two-layer graphene 3 similarly. In this case, although the two-layer graphene 3 becomes an $N^+$ type in the region, a band gap is formed due to the difference in electron donating property between the upper and lower molecular materials.

As above, in the graphene tunnel transistor in this example, the two-layer graphene 3 substantially becomes a $P^+N^-N^+$ structure in the channel region between the source electrode 32 and the drain electrode 33, and a sufficient band gap is formed.

In this example, when forming the first upper layer 34a, the second upper layer 34b, and the third upper layer 34c constituting the upper layer 34, the rate of these to cover the two-layer graphene 3 is adjusted, thereby making it possible to control individual conductivity-type doping states (concentrations) of $P^+$, $N^-$, and $N^+$ in the $P^+N^-N^+$ structure.

In this example, as the N-type dopant molecule, N-dimethyl-3-aminopropylmethoxysilane, TCNQ, and PEI are cited, and as the P-type dopant molecule, $F_4$-TCNQ and alkylsilane fluoride are cited, but these are one example.

In the graphene tunnel transistor having a $P^+N^-N^+$ structure according to this embodiment, it is possible to select the molecular materials of the first lower layer 31a and the second lower layer 31b constituting the lower layer 31, the molecular materials of the first upper layer 34a, the second upper layer 34b, and the third upper layer 34c constituting the upper layer 34, and the electrode materials of the source electrode 32 and the drain electrode 33 as follows.

TABLE 5

| | $P^+N^-N^+$ STRUCTURE CASE | | |
|---|---|---|---|
| | $P^+$ | $N^-$ | $P^+$ |
| UPPER-SIDE MATERIAL | $F_4$—TCNQ/ $F_2$—HCNQ | TCNQ/$NO_2$ | PEI/ FERROCENE/ COBALTOCENE/ |
| LOWER-SIDE MATERIAL | ALKYLSILANE FLUORIDE, N-PHENYL-3-AMINOTRIMETHOXYSILANE, 3-MERCAPTOTRIMETHOXYSILANE AND SO ON, P-TYPE DOPANT SAM | $NH_2$—SAM/ $NH(CH_3)$—SAM/ $N(CH_3)_2$-SAM | $NH_2$—SAM/ $NH(CH_3)$—SAM/ $N(CH_3)_2$—SAM |

ELECTRODE MATERIAL $p^+$ SIDE: Au, Pd, Pt, Ni, Co, Ir $n^+$ SIDE: Ti, Zr, Hf, V, Ta, Sc, Y, La

As for the molecular materials of the lower layer 31 (lower-side material), for the material of the N-type dopant molecule of the first lower layer 31a, one kind selected from among $NH_2$-SAM, $NH(CH_3)$-SAM, and $N(CH_3)_2$-SAM is used.

For the material of the P-type dopant molecule of the second lower layer 31b, one kind selected from among alkylsilane fluoride, N-phenyl-3-aminotrimethoxysilane, 3-mercaptotrimethoxysilane, and so on is used.

As for the molecular materials of the upper layer 34 (upper-side material), for the material of the P-type dopant molecule of the first upper layer 34a, TCNQ or $NO_2$ is used.

For the material of the P-type dopant molecule of the second upper layer 34b, $F_4$-TCNQ or $F_2$-HCNQ is used.

For the material of the N-type dopant molecule of the third upper layer 34c, one kind selected from among PEI, ferrocene, and cobaltocene is used.

For the electrode material of the source electrode 32, a conductive material that hardly modulates an electronic state of the P-type portion of the two-layer graphene 3, for example, one kind of a metal material of Au, Pd, Pt, Ni, Co, and Ir is used. In this example, as described above, Ti is formed very thinly, (which is 1 nm or so), as an adhesive layer, and thereby Pt functions as a conductive material that hardly modulates an electronic state of the P-type portion of the two-layer graphene 3.

For the electrode material of the drain electrode 33, a conductive material that hardly modulates an electronic state of the N-type portion of the two-layer graphene 3, for example, one kind of a metal material of Ti, Zr, Hf, V, Ta, Se, Y, and La is used. In this example, as described above, Ti is formed relatively thickly, (which is 20 nm or so), as the electrode material, to thereby function as a conductive material that hardly modulates an electronic state of the N-type portion of the two-layer graphene 3.

As explained above, according to this example, there is fabricated a highly reliable graphene tunnel transistor having a $P^+N^-N^+$ structure that includes a band gap formed by the molecular materials and uses a nanocarbon material as a channel with a relatively simple structure.

According to the embodiments, there is fabricated a highly reliable electronic device including a band gap formed by molecular materials and using a nanocarbon material as a channel with a relatively simple structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device, comprising:
   a nanocarbon material;
   a first electrode and a second electrode that are electrically connected to the nanocarbon material;
   a third electrode that is provided between the first electrode and the second electrode;
   a lower layer that is formed under the nanocarbon material and is made of at least one kind of a molecular material having a doping function; and
   an upper layer that is formed on the nanocarbon material and is made of a first molecular material and a second molecular material having doping functions whose polarities are reverse to each other, wherein
   the second molecular material is provided within at least one of a first recessed part between the first electrode and the third electrode and a second recessed part between the second electrode and the third electrode, and contacts with the first molecular material and the third electrode,
   the nanocarbon material constitutes one type selected from among an NPN structure, a PNP structure, an $N^+P^-P^+$ structure, and a $P^+N^-N^+$ structure in a region between the first electrode and the second electrode by the lower layer and the upper layer.

2. The electronic device according to claim 1, wherein
   of the molecular material of the lower layer and the molecular materials of the upper layer,
   the molecular material having an N-type doping function is at least one kind of molecule selected from among PEI(Polyethylenimine), ferrocene, cobaltocene, tetrathiafulvalene, 3-aminopropyltrimethoxy(ethoxy)silane, N-methyl-3-aminopropylmethoxysilane, and N-dimethyl-3-aminopropylmethoxysilane, and
   the molecular material having a P-type doping function is at least one kind of molecule selected from among $F_4$-TCNQ(2,3,5,6-tetrafluoro-7,7,8,8-tetracyanoquinodimethane), pentacene fluoride, diazonium salt, benzylviologen, alkylsilane fluoride, N-phenyl-3-aminotrimethoxysilane, and 3-mercaptotrimethoxysilane.

3. The electronic device according to claim 1, wherein the molecular material of the lower layer is formed as a SAM(Self-assembled monolayer) film.

4. The electronic device according to claim 1, wherein the electrodes are formed of a conductive material that does not modulate an electronic state of the nanocarbon material.

5. The electronic device according to claim 1, wherein the nanocarbon material is graphene stacked in two layers or three layers.

6. A method of manufacturing an electronic device, comprising:
   forming a lower layer that is made of at least one kind of a molecular material having a doping function;
   forming a nanocarbon material on the lower layer;
   forming a first electrode and a second electrode that are electrically connected to the nanocarbon material;
   forming a third electrode between the first electrode and the second electrode; and
   on the nanocarbon material, forming an upper layer that is made of a first molecular material and a second molecular material having doping functions whose polarities are reverse to each other, wherein
   the second molecular material is provided within at least one of a first recessed part between the first electrode and the third electrode and a second recessed part between the second electrode and the third electrode, and contacts with the first molecular material and the third electrode,
   the nanocarbon material constitutes one type selected from among an NPN structure, a PNP structure, an $N^+P^-P^+$ structure, and a $P^+N^-N^+$ structure in a region between the first electrode and the second electrode by the lower layer and the upper layer.

7. The method of manufacturing the electronic device according to claim 6, wherein
   a rate of the molecular materials of the upper layer to cover the nanocarbon material is adjusted, and one type of a doping state selected from among the NPN structure, the PNP structure, the $N^+P^-P^+$ structure, and the $P^+N^-N^+$ structure in the nanocarbon material is controlled.

8. The method of manufacturing the electronic device according to claim 6, wherein
   of the molecular material of the lower layer and the molecular materials of the upper layer,
   the molecular material having an N-type doping function is at least one kind of molecule selected from among PEI(Polyethylenimine), ferrocene, cobaltocene, tetrathiafulvalene, 3-aminopropyltrimethoxy(ethoxy)silane, N-methyl-3-aminopropylmethoxysilane, and N-dimethyl-3-aminopropylmethoxysilane, and the molecular material having a P-type doping function is at least one kind of molecule selected from among $F_4$-TCNQ(2,3,5,6-tetrafluoro-7,7,8,8-tetracyanoquinodimethane), pentacene fluoride, diazonium salt, benzylviologen, alkylsilane fluoride, N-phenyl-3-aminotrimethoxysilane, and 3-mercaptotrimethoxysilane.

9. The method of manufacturing the electronic device according to claim 6, wherein
the molecular material of the lower layer is formed as a SAM(Self-assembled monolayer) film.

10. The method of manufacturing the electronic device according to claim 6, wherein
the electrodes are formed of a conductive material that does not modulate an electronic state of the nanocarbon material.

11. The method of manufacturing the electronic device according to claim 6, wherein
the nanocarbon material is graphene stacked in two layers or three layers.

* * * * *